United States Patent
Hottinen

(10) Patent No.: US 7,421,033 B2
(45) Date of Patent: Sep. 2, 2008

(54) METHOD FOR IMPROVING THE PERFORMANCE OF A CODING IN A RADIO COMMUNICATIONS SYSTEM

(75) Inventor: Ari Hottinen, Espoo (FI)

(73) Assignee: Nokia Corporation, Espoo (FI)

( * ) Notice: Subject to any disclaimer, the term of this patent is extended or adjusted under 35 U.S.C. 154(b) by 538 days.

(21) Appl. No.: 10/485,507

(22) PCT Filed: Aug. 3, 2001

(86) PCT No.: PCT/EP01/09003

§ 371 (c)(1), (2), (4) Date: Feb. 2, 2004

(87) PCT Pub. No.: WO03/015287

PCT Pub. Date: Feb. 20, 2003

(65) Prior Publication Data

US 2004/0184553 A1 Sep. 23, 2004

(51) Int. Cl.
*H04L 5/12* (2006.01)

(52) U.S. Cl. .................. 375/264; 375/295; 375/316; 714/810

(58) Field of Classification Search .......... 714/1, 714/6, 794, 748, 755, 750, 752, 758, 786, 714/759, 767, 768, 790, 792, 800, 802, 810, 714/820; 375/260–262, 265, 267, 275, 279–281, 375/286, 295, 298, 299, 316, 332, 340, 341, 375/347, 130–143, 264, 220
See application file for complete search history.

(56) References Cited

U.S. PATENT DOCUMENTS 6,807,238 B1 * 10/2004 Rhee et al. .................. 375/340
2004/0049725 A1 * 3/2004 Golitschek et al. .......... 714/749

FOREIGN PATENT DOCUMENTS

EP  0 490 552 A2  6/1992

OTHER PUBLICATIONS

Stefan Eriksson et al., "Comparison of Link Quality Control Strategies for Packet Data Services in EDGE", May 1999, 49th IEEE Vehicular Technology Conference, vol. 2, pp. 938-942.*

(Continued)

*Primary Examiner*—David C. Payne
*Assistant Examiner*—Rahel Guarino
(74) *Attorney, Agent, or Firm*—Squire, Sanders & Dempsey L.L.P.

(57) ABSTRACT

The invention relates to a method for improving the performance of data transmissions over a communications channel, wherein data is coded and modulated for transmission, wherein coding the data results in differently coded bits. In order to allow for a simple way of a more flexible coding, it is proposed that the differently coded bits are mapped for modulation to different modulation symbols of a symbol alphabet, to which modulation symbols different relative reliabilities are assigned, and wherein by mapping the coded bits to the modulated symbols, different reliabilities are associated to differently coded bits depending on the conditions on the communications channel. The invention equally relates to a corresponding communications system and to elements of such a communications system.

25 Claims, 3 Drawing Sheets

OTHER PUBLICATIONS

John Hokfelt et al., "Optimizing the energy of different bitstreams of turbo codes", Aug. 1996, Proceedings of turbo coding seminar, pp. 59-63.*

Park et al, "Transmission Power Allocation in Turbo Codes", VTC 2000-Spring. 2000 IEEE 51st Vehicular Technology Conference Proceedings. May 15-18, 2000, vol. 3 of 3. Conf. 51, pp. 2073-2075, XP000968369.

Hokfelt et al, "Optimizing the Energy of Different Bit Streams of Turbo Codes", Proc. Turbo Coding Seminar, Aug. 1996, pp. 59-63, XP002902444.

Mohammadi et al, "Unequal Error Protection on the Turbo-Encoder Output Bits", 1997 IEEE International Conference on Communications, Montreal, Jun. 8-12, 1997, vol. 2, Jun. 8, 1997, pp. 730-734, XP000742037.

Mohammadi et al, "Unequal Power Allocation to the Turbo-Encoder Output Bits with Application to CDMA Systems", IEEE Transactions on Communications, IEEE Inc. vol. 47, No. 11, Nov. 1999, pp. 1609-1610, XP000871368.

Tirkkonen et al, "Tradeoffs between rate, puncturing and orthogonality in space-time block codes", IEEE International Conference on Communications 2001. ICC2001, vol. 4, Jun. 11-14, 2001, pp. 1117-1121, XP002902445.

Mohammadi et al, "Effect of the labeling of the constellation points in a combined turbo-code and modulation." Proc. 1996 Conf. Information Science and Systems CISS '96, Mar. 1996, pp. 67-69, XP002902446.

Eriksson et al, "Comparison of Link Quality Control Strategies for Packet Data Services in EDGE", 49th IEEE Vehicular Technology Conference, May 16-20, 1999, vol. 2, pp. 938-942, XP10342128.

"Performance Evaluation of the Enhanced Symbol Mapping Method Based on Priority (SMP) in HSDPA", Samsung Electronics Co., Busan, Korea, 3GPP TSG-RAN WGI Meeting #20—R1-010533, May 21-25, 2001.

"On Optimal Power Allocation for Turbo Codes", Duman et al, ISIT 1997, Ulm, Germany, Jun. 29-Jul. 4, 1997, IEEE, p. 104-.

Duman et al, "The Union Bound for Turbo Coded Modulation Systems over Fading Channels", Global Telecommunications Conference—Globecom '99, 1999, pp. 520-524.

"Turbo Coding", Heegard et al, Kluwer Academic Publishers, date not avail.

* cited by examiner

METHOD FOR IMPROVING THE PERFORMANCE OF A CODING IN A RADIO COMMUNICATIONS SYSTEM

FIELD OF THE INVENTION

The invention relates to a method for improving the performance of data transmissions over a communications channel, in particular the air interface in a radio communications system, wherein data is coded and modulated for transmission. The invention equally relates to a radio transmission unit and to an encoder for such a radio transmission unit, to a radio receiving unit and to a decoder for such a radio receiving unit, and finally to a communications system comprising at least such a radio transmission unit.

BACKGROUND OF THE INVENTION

For radio communications systems, in which data is transmitted over the air interface from a transmitting unit to a receiving unit, it is known from the state of the art to transmit the respective data either in uncoded or in coded form.

Coding of to be transmitted data is used in order to be able to detect and/or correct the errors occurring in the transmission of data on the transmission path on the air interface. In systematic coding methods, e.g., for all data, systematic and parity bits are created. The systematic bits correspond to the data in uncoded form and the parity bits constitute additional, coded redundant information. For a coding rate of ⅓, for example, a systematic encoder provides for each systematic bit two parity bits.

Turbo coding is a systematic coding method that uses recursive, systematic convolutional codes. The parity bits are provided by different constituent encoders using different constituent polynomials. The decoding is carried out iteratively in order to obtain a good error correction performance.

Parallel concatenated turbo codes differ in the way the constituent polynomials are defined and in the way interleaving is done. The polynomials are searched for a given operating point, bearing in mind complexity requirements. As in the other known coding methods, all encoded bits are transmitted with equal power. In case the actual operating point differs from the operating point for which the polynomials were determined, e.g. because of changed channel conditions, the fixed polynomials do not result any more in the best performance of coding.

It is known to vary an employed code by a method called puncturing, according to which every $n^{th}$ bit of a code is left out, thus reducing the coding rate, but this allows only for a limited adaptation to channel conditions.

FIGS. 1 and 2, which were extracted from "Turbo Coding" by Chris Heegard and Stephen B. Wicker, Kluwer Academic Publishers, oppose for two different turbo decoding methods the performance obtained with transmitted coded data and the performance obtained with transmitted uncoded data.

In both figures, the BER (bit error rate) is depicted over the Eb/No (Eb=energy per bit; No=noise power density per Hz). Four curves with asterisk illustrate in each figure the performance with coded data based on different numbers of iterations in decoding. The number next to each curve indicates the number of iterations carried out. A further curve-without asterisk illustrates in each figure the performance with uncoded data.

FIG. 1 is based on serial turbo decoding. It can be seen that the BER of the uncoded data is better than the BER of coded data irrespective of the number of iterations for a Eb/No below approximately 1.1 dB. For higher Eb/No, in contrast, the BER of the coded data is better than the BER of the uncoded data, the respective threshold value of the Eb/No depending on the number of iterations used for decoding.

FIG. 2 is based on parallel turbo decoding. As can be seen in the diagram, the threshold value of the Eb/No for which the performance with uncoded data is better than with coded data depending on the number of iterations is reduced, but in particular for lower numbers of iterations, there still exist a range of better channel conditions, in which uncoded data results in a better performance.

FIGS. 1 and 2 therefore illustrate that the conventional turbo coding methods are not suited to enable an optimal coding performance for all channel conditions.

SUMMARY OF THE INVENTION

It is an object of the invention to provide a method, a radio transmission unit and a transmission encoder that allow for a simple way of a more flexible coding.

This object is reached on the one hand with a method for improving the performance of data transmissions over a communications channel, which can be for example the air interface. With the proposed method, the data is coded and modulated for transmission, wherein coding said data results in differently coded bits, i.e. in bits of at least two different classes. One of these different classes may also comprise uncoded bits. The differently coded bits are mapped for modulation to different modulation symbols within the symbol alphabet, to which modulation symbols different relative reliabilities are assigned. By the mapping of the coded bits to the modulation symbols, different reliabilities are associated to the differently coded bits depending on the conditions on said communications channel.

On the other hand, the object is reached with a radio transmission unit for a radio communications system comprising encoding means for encoding data that is to be transmitted over a communications channel to a receiving unit outputting differently coded bits. The proposed radio transmission unit further comprises modulating means mapping the differently coded bits to different modulation symbols within the symbol alphabet, to which different modulation symbols different relative reliabilities are assigned. The mapping is carried out and/or the modulation alphabet is modified according to the proposed method of the invention. Transmitting means of the radio transmission unit further take care of transmitting each modulation symbol with the assigned reliability.

Moreover, the object is reached with a transmission encoder for a radio transmission unit of a radio communications system comprising corresponding encoding means and corresponding modulation means.

The object of the invention is also reached with a decoder for a radio receiving unit of a radio communications system comprising means for demodulating and decoding modulation symbols transmitted by the proposed radio transmission unit. The decoder has information about a respective association of employed relative reliabilities to differently coded bits in the radio transmission unit, and the means for demodulating and decoding use this information in demodulating and/or decoding the received modulation symbols. The object of the invention is also reached with a radio receiving unit comprising such a decoder.

Finally, the object of the invention is reached with a communications system comprising at least the proposed radio transmission unit and a radio receiving unit.

The invention proceeds from the fact that the performance of transmissions achieved with uncoded data can be better or worse than the performance of a transmission achieved with coded symbols that are all transmitted with the same transmission power or energy, depending at least on part on the quality of the transmission path. The invention proposes to introduce an additional parameter for coding and modulation that can be used for taking account of the conditions on the transmission path. This is achieved by enabling an unequal distribution of the relative reliabilities to different modulation symbols to which differently coded bits are mapped. Thereby, also an unequal distribution of the reliabilities of the differently coded bits mapped to these symbols is obtained. The reliabilities assigned to the modulation symbols can correspond to assigned relative effective transmission powers or different effective transmission energies.

If the distribution of different reliabilities to the differently coded bits is moreover adjustable, an adjustment of the transmissions to varying channel conditions is enabled and thereby an enhanced performance in decoding without having to touch a given code in an encoder of a transmitting end. If the reliabilities are changed with different labelings, though, the modulator in the transmitter changes depending on the channel quality. Labeling denotes any method in which a sequence of input bits is associated with a particular output symbol, e.g. Ggay labeling. The reliabilities can be changed also by keeping the signal labeling fixed, but by modifying the relative transmit powers, e.g. in the I and Q channels, depending on which bits need to have a higher reliability. For example, with QPSK modulation equal reliabilities can be achieved with equal distance between each constellation point, while the relative reliabilities can be changed by using an asymmetric modulation alphabet, in which the distance between constellation points in the I-channel are further apart than those in the Q-channel.

At the same time, also the decoder at the receiving end does not necessarily have to be modified, since conventional weighting allows the receiving end to operate without knowing the weighting patterns used at the transmitting end. However, if the decoder knows the relative reliabilities these might be taken into account e.g. by changing the a-priori probabilities of the input bits differently for the bits with different reliabilities.

The achieved enhancement depends on the chosen association of relative transmission powers to the differently coded bits and on the quality of the transmission path, e.g. on the effective instantaneous or long-term average signal-to-noise ratio in the transmission chain. The invention thereby defines a parameterised coding concept, in which the coding rate can remain fixed, but in which the reliability is allocated differently for at least two classes of bits, depending on the state or quality of the employed communications channel.

The precise power or energy allocation can of course depend also on other aspects, such as the encoding and modulation method used, and the target quality of service point, e.g. the BER or FER (frame error rate). The overall power employed for transmissions can be power controlled in any suitable way, while according to the invention, relative portions of this overall power are associated in addition differently to differently coded bits as a function of the channel state.

The radio transmission unit can be for example a base station or a mobile station in its transmitting function and the radio reception unit a base station or a mobile station in its receiving function.

Preferred embodiments of the invention become apparent from the subclaims.

The association of different reliabilities to the differently coded bits can be realized in different ways. In a first preferred embodiment, the mapping of the differently coded bits to the modulation symbols is fixed, and different relative reliabilities are assigned to the modulation symbols depending on the channel conditions.

In a second preferred embodiment, the relative distribution of the reliabilities to the different modulation symbols is fixed, and the differently coded bits are mapped to the modulation symbols depending on the current channel conditions.

A third preferred embodiment is a combination of the first and the second preferred embodiment, in which both, the mapping and the distribution of the reliabilities to the modulation symbols depends on the current channel conditions.

The relative reliabilities can be controlled by the modulator. For example, different labelings for 16-QAM (quadrature amplitude modulation) constellations can be employed, or different powers for I and Q channels with QPSK (quadrature phase shift keying). Equally, different classes of bits may be transmitted in separate symbols, and these separate symbols can be transmitted with a different relative transmit power, for instance on orthogonal channels, using orthogonal codes, using different carriers, different transmit antennas, or using different transmission times.

In another advantageous embodiment of the invention, a feedback information is transmitted from a receiving end receiving transmitted modulation symbols. This feedback information can either contain an indication of the present quality of the communication channel, represented e.g. by the SNR (Signal to Noise Ratio) or the fading distribution, etc. at the receiving end. Or the feedback information can contain already an indication of the desired association of different relative reliabilities to said differently coded bits. The distribution of reliabilities to the different symbols of coded data, and thus the distribution of different reliabilities to the differently coded bits, can then be carried out according to this feedback information. Alternatively or additionally, the radio transmission unit may measure the channel state without explicit feedback, e.g. in TDD systems. Such a linking of the distribution of the power to the quality of the transmission path constitutes an additional coding of the transmitted data without changing the encoder itself.

Alternatively, in particular when there is no information available at the transmitting end on the channel conditions, the distribution of the relative reliabilities may be fixed. The reliabilities can be fixed depending on the target SNR required to meet a given Quality of Service, like BER or FER etc., rather than on measured SNR. The target SNR depends on the channel fading distribution, on the actual coding and modulation concept used, and on the requires bit or packet error rate.

The invention can be used in particular in combination with systematic codings. In this case, the uncoded systematic bits can be assigned another reliability than the redundant or parity bits output e.g. by constituent encoders. The systematic bits and the parity bits are then the differently coded bits resulting in the coding of the data.

In the case of a systematic coding like power coding, preferably the reliabilities are distributed to systematic and parity bits in a way that the worse the channel conditions are, the more reliability is associated to the systematic bits, since bad channel conditions result in little coding gain. With particularly bad channel conditions, more reliability is associated to the systematic bits than to the parity bits. On the other hand, the reliabilities are associated with an equal distribution to the systematic and the parity bits or a higher reliability is associated to the parity bits, in case of particularly good channel conditions. The association of relative reliabilities to systematic and redundant bits in between the two extremes of the channel conditions can be in between the associations of relatives reliabilities for those extreme conditions.

By weighting the redundant bits higher than the systematic bits, steeper BER curves can be obtained for high SNR at the expense of performance at low SNR. This may even permit the use of shorter frames than with ordinary turbo coding.

Exact patterns for associating relative reliabilities can for example be found similarly to finding the best puncturing patterns.

In case that a plurality of parity bits are provided by an employed systematic coding, alternatively or additionally to weighting the systematic and parity bits differently in the association of different relative reliabilities, the parity bits may also be weighted differently among each other. It is known, e.g. from the above cited document "Turbo Coding", page 103, that serial turbo decoders favour the constituent decoder that is activated first, thus falsifying the result. With the method of the invention, this can be compensated already at the transmitting end by associating different relative reliabilities to the parity bits.

The modulation means of the radio transmission unit and of the transmission (TX) encoder of the invention can be suited to employ any association of relative reliabilities to differently coded bits proposed for the method of the invention.

The invention can be employed in particular, though not exclusively, with CDMA (Code Division Multiple Access).

In the paper "Tradeoffs Between Rate, Puncturing and Orthogonality in Space-Time Block Codes", IEEE International conference on communications, Helsinki; June 2001, by O. Tirkkonen and A. Hottinen, a multi-antenna transmission concept was considered, in which different symbols are transmitted with different power in order to achieve a power balancing. In order to obtain equal BER for all bits, it was proposed to use different powers for QPSK and for 16-QAM. The invention can also be employed to improve the results of this paper, e.g. by allocating different bits to QPSK symbols and to 16-QAM. For example, if the transmit powers of each symbol is the same, the systematic bits can be allocated to QPSK symbols when operating at low SNR, while the parity bits are allocated to 16-QAM

BRIEF DESCRIPTION OF THE FIGURES

In the following, the invention is explained in more detail with reference to drawings, of which

DETAILED DESCRIPTION OF THE INVENTION

Figure 1:
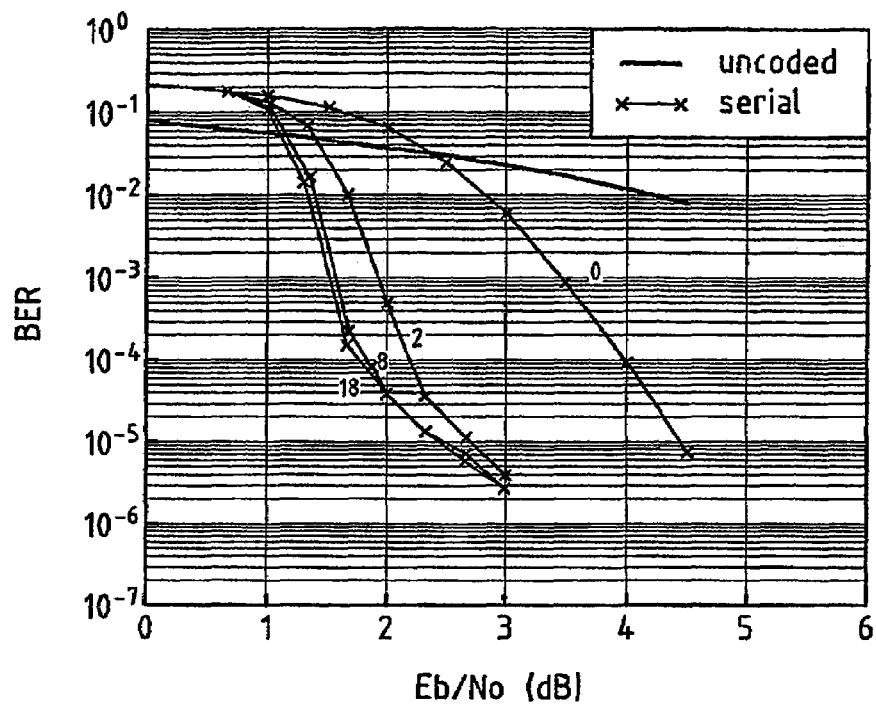
FIG. 1 illustrates the performance of turbo decoding in serial mode.
Figure 2:
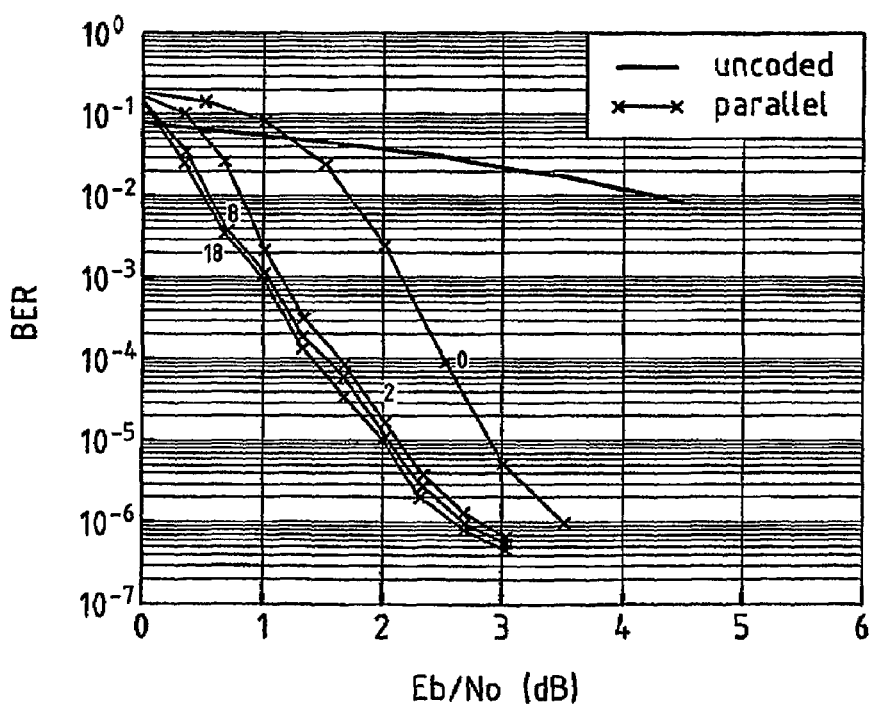
FIG. 2 illustrates the performance of turbo decoding in parallel mode.

FIGS. 1 and 2 have already been described above.

Figure 3:
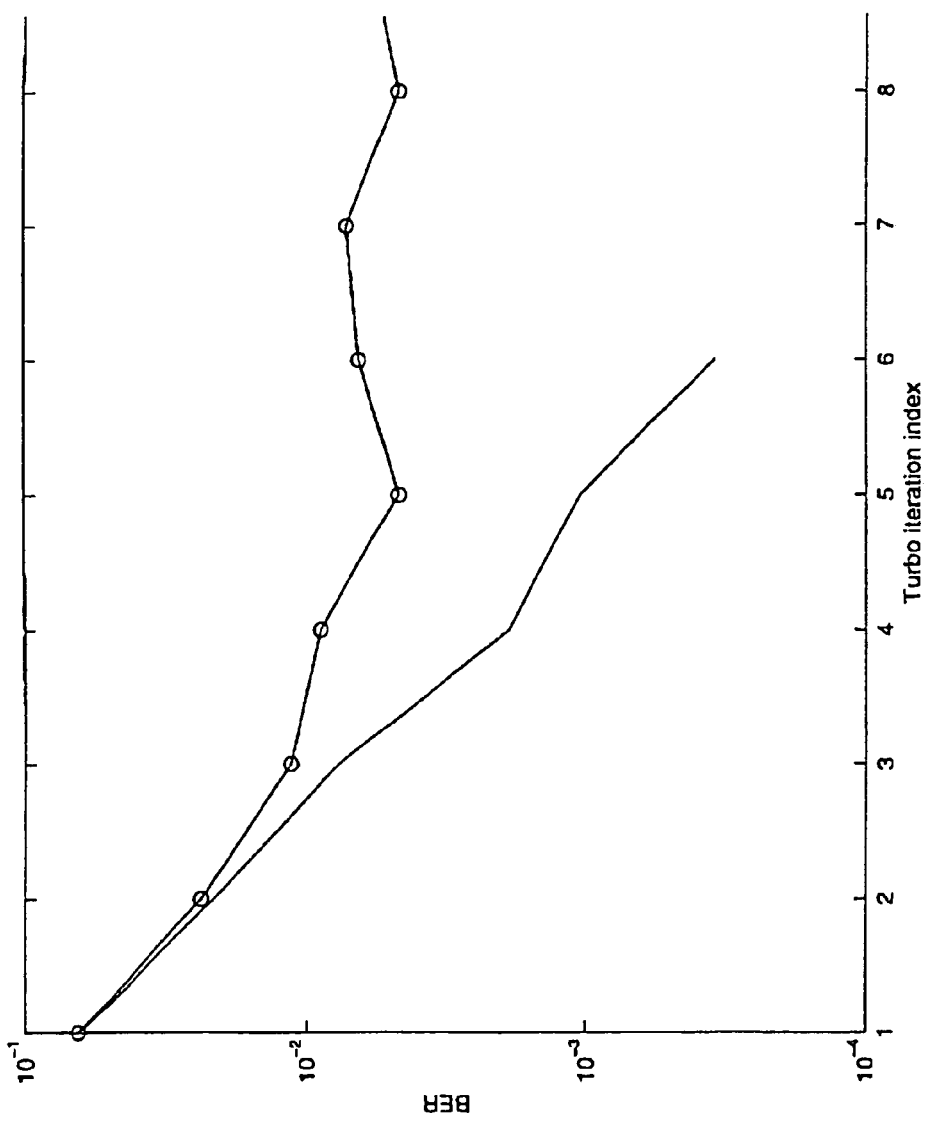
FIG. 3 illustrates simulation results of the performance of coding with and without weighting according to the invention.
Figure 4:
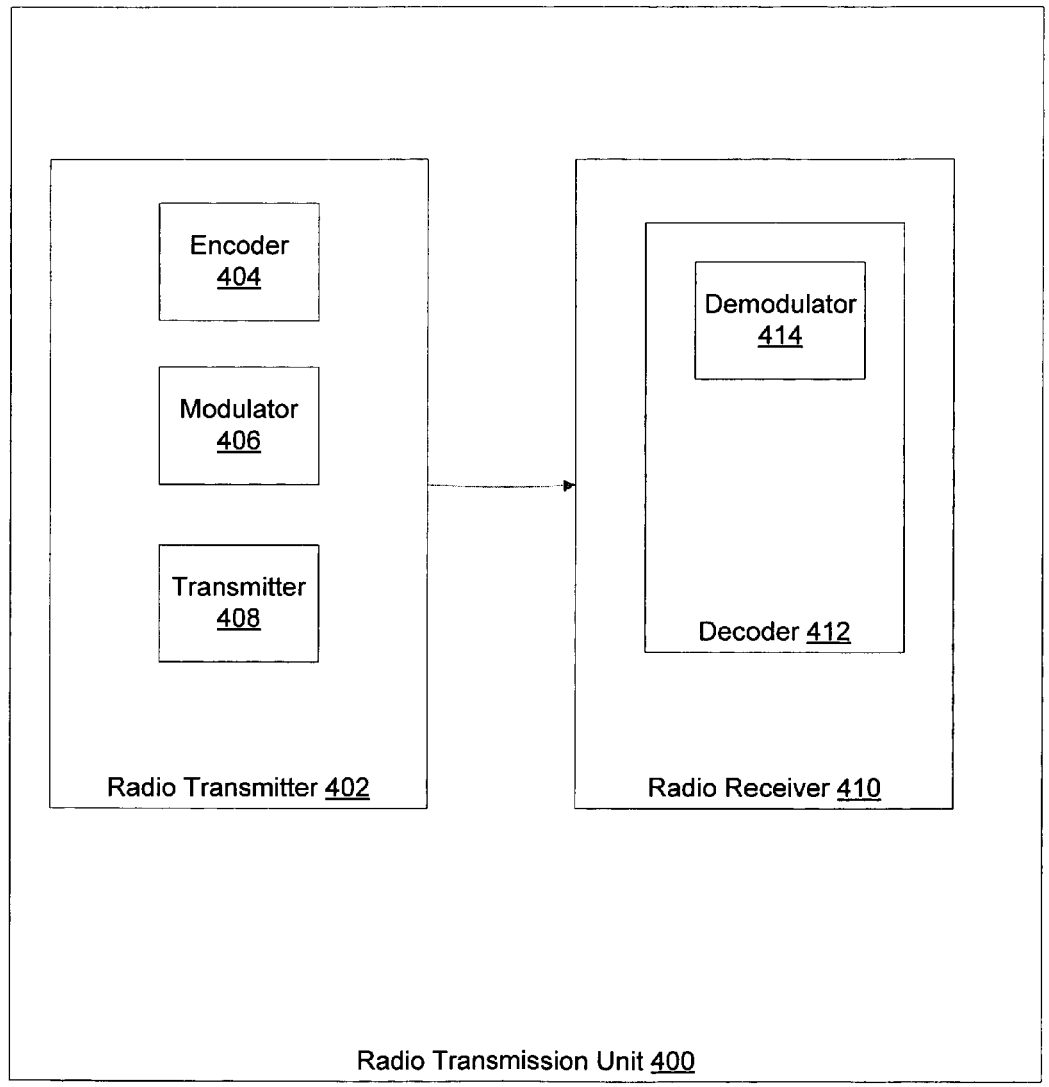
FIG. 4 illustrates the feedback information associated with the radio transmitter unit with the encoder, the modulator; and the radio receiver unit with the decoder, demodulator.

FIG. 3 illustrates the performance of a coding that can be achieved with coded data weighted according to an example of the method of the invention. The depicted performances are based on a simulation.

The described example of the method of the invention is based on a conventional ⅓ serial turbo coding employed in a radio communications system. The system comprises a radio transmission unit with a turbo encoder and a radio receiving unit with a turbo decoder. The turbo encoder comprises two constituent encoders, each using a constituent polynomial that was optimised for a given operating point.

The turbo encoder receives data that is to be transmitted to the receiving unit. The data is processed in the two constituent encoders by applying the different constituent polynomials. The turbo encoder outputs in sequence one systematic bit that corresponds to an uncoded data bit and two parity bits, each constituting the output of a different one of the two constituent decoders. The thus coded data is then transmitted with the currently available total power for each triplet of bits to the radio receiving unit, using an interleaver size of 320 bits. The Eb/No at the receiver is supposed to be 1 dB.

The radio receiving unit receives the coded data and supplies it to the serial turbo decoder. The turbo decoder applies 9 Log-MAP iterations to the received coded data, the result of each iteration being available.

For the simulation, first equal weights [1 1 1] were assigned to all bits, where the first value is the weight for the systematic bit and the second and third value the weight for the first and the second parity bit. The bits were then transmitted with the transmission power distributed to the bits according to these weights. This corresponds to a conventional transmission with equal transmission power for all systematic and parity bits.

Next, different weights [0.93 1.03 1.03] were assigned to the bits, the first value being again the weight for the systematic bit and the second and third value the weight for the first and the second parity bit. This means that about 10% higher weights were assigned to the two parity bits than to the systematic bit of the ⅓ code. According to these weights, the parity bits were then transmitted with a transmission power about 10% higher than the transmission power with which the systematic bits were transmitted.

In FIG. 3, the BER resulting in decoding for the two different transmissions is depicted over the number of turbo iterations carried out. The BER resulting from the transmission with the total power distributed equally according to the equal weights is shown in FIG. 3 as a curve with a circle at every iteration step. The BER resulting from the transmission with the power distributed according to the different weights is shown in FIG. 3 as simple line. As can be seen, with a single turbo iteration, the BER is equal for both weightings, but with every additional iteration the BER of the curve resulting from the weighted transmission decreases much more rapidly than the BER resulting from the unweighted transmission.

The two curves in FIG. 3 therefore illustrate that the performance of a coding can be influenced significantly when employing the method according to the invention by distributing the available total transmission power differently to different symbols of a code. This implies that the proposed weighting allows to tailor the code performance without any increase of complexity in the transmitter or in the receiver.

The invention claimed is:

1. A method for improving the performance of data transmissions over a communications channel comprising:
coding and modulating data for transmission, wherein coding said data results in differently coded bits, wherein said differently coded bits are mapped for modulation to different modulation symbols of a symbol alphabet, to which modulation symbols different relative reliabilities are assigned, and
wherein by mapping said coded bits to said modulation symbols, different reliabilities are associated to differently coded bits depending on the conditions on said communications channel.

2. The method according to claim 1, wherein the different relative reliabilities of said modulation symbols are given by the assignment of a different relative transmit power or a different relative effective transmit energy.

3. The method to claim 1, wherein for associating different reliabilities to the differently coded bits depending on the channel conditions, varying different relative reliabilities are assigned to said modulation symbols depending on the channel conditions.

4. The method according to claim 1, wherein for associating different reliabilities to the differently coded bits depending on the channel conditions, said differently coded bits are mapped to said modulation symbols depending on the channel conditions.

5. The method according to claim 4, wherein the assignment of the relative reliabilities to the modulation symbols is fixed or adjustable.

6. The method according to claim 1, wherein for enabling an association of different reliabilities to said differently coded bits depending on the channel conditions, a feedback is transmitted from a receiving unit receiving signals on said communications channel.

7. The method according to claim 6, wherein said feedback information contains an indication of the conditions on said communication channel.

8. The method according to claim 6, wherein said feedback information contains an indication of the desired association of different relative reliabilities to said differently coded bits, which indication is generated based on the conditions on said communication channel determined by said receiving unit.

9. The method according to claim 1, wherein the employed coding is a systematic coding resulting in uncoded systematic bits and parity bits, and wherein said systematic bits and said parity bits constitute said differently coded bits.

10. The method according to claim 9, wherein the relative reliabilities associated to said systematic bits is different from the relative reliabilities associated to said parity bits.

11. The method according to claim 10, wherein the relative reliabilities associated to said systematic bits are the higher the worse the channel conditions are.

12. The method according to claim 9, wherein the coding of said data results in at least one systematic bit and at least two parity bits respectively, and wherein the relative reliabilities associated to the parity bits is distributed differently to the different parity bits with a weighting suited to compensate for a bias in decoding for at least one of the parity bits compared to at least one other of the parity bits.

13. The method according to claim 1, wherein the employed coding is turbo coding.

14. A radio transmission unit for a radio communications system, comprising:
an encoding unit configured to encode data that is to be transmitted over a communications channel to a receiving unit outputting differently coded bits;
a modulating unit configured to map said differently coded bits to different modulation symbols of a symbol alphabet, to which different modulation symbols different relative reliabilities are assigned, wherein by mapping said coded bits to said modulation symbols, different reliabilities are associated to differently coded bits depending on the conditions on said communications channel; and
a transmitting unit configured to transmit each modulation symbol with the assigned reliability.

15. The radio transmission unit according to claim 14, further comprising a receiving unit configured to receive a feedback information from a receiving unit receiving signals on said communications channel, on which feedback information the association of the relative reliabilities to differently coded bits is based.

16. The radio transmission unit according to claim 14, wherein the encoding means is a systematic encoder.

17. The radio transmission unit according to claim 16, wherein the encoding unit is a turbo encoder.

18. A transmission encoder for a radio transmission unit of a radio communications system, comprising:
an encoding unit configured to encode data that is to be transmitted over a communications channel from a radio transmission unit to a radio receiving unit, said encoding means outputting at least two differently coded bits; and
a modulating unit configured to map said differently coded bits to different modulation symbols of a symbol alphabet, to which different modulation symbols different relative reliabilities are assigned, wherein by mapping said coded bits to said modulation symbols, different reliabilities are associated to differently coded bits depending on the conditions on said communications channel.

19. The transmission encoder according to claim 18, wherein said encoding unit is a systematic encoder.

20. The transmission encoder according to claim 19, wherein said encoding unit is a turbo encoder.

21. A radio receiving unit for a radio communications system, comprising:
a decoder with means for demodulating and decoding modulation symbols of a symbol alphabet transmitted by a radio transmission unit for the radio communications system, the radio transmission unit comprising an encoding unit configured to encode data that is to be transmitted over a communications channel to a receiving unit outputting differently coded bits, a modulating unit configured to map said differently coded bits to different modulation symbols of a symbol alphabet, to which different modulation symbols different relative reliabilities are assigned, wherein by mapping said coded bits to said modulation symbols, different reliabilities are associated to differently coded bits depending on the conditions on said communications channel, and a transmitting unit configured to transmit each modulation symbol with the assigned reliability,
which decoder has information about a respective association of an employed relative reliabilities to differently coded bits in said radio transmission unit, wherein said means for demodulating and decoding use said information in demodulating and/or decoding said modulation symbols.

22. A decoder for a radio receiving unit of a radio communications system, comprising:
means for demodulating and decoding modulation symbols of a symbol alphabet transmitted by a radio transmission unit for the radio communications system, the radio transmission unit comprising an encoding unit configured to encode data that is to be transmitted over a communications channel to a receiving unit outputting differently coded bits, a modulating unit configured to map said differently coded bits to different modulation symbols of a symbol alphabet, to which different modulation symbols different relative reliabilities are assigned, wherein by mapping said coded bits to said modulation symbols, different reliabilities are associated to differently coded bits depending on the conditions on said communications channel, and a transmitting unit configured to transmit each modulation symbol with the assigned reliability, which decoder has information about a respective association of employed relative reliabilities to differently coded bits in said radio transmission unit, wherein the means for demodulating and decoding use said information in demodulating and/or decoding said modulation symbols.

23. A communications system comprising:

at least a radio transmission unit for the radio communications system, the radio transmission unit comprising an encoding unit configured to encode data that is to be transmitted over a communications channel to a receiving unit outputting differently coded bits, a modulating unit configured to map said differently coded bits to different modulation symbols of a symbol alphabet, to which different modulation symbols different relative reliabilities are assigned, wherein by mapping said coded bits to said modulation symbols, different reliabilities are associated to differently coded bits depending on the conditions on said communications channel, and a transmitting unit configured to transmit each modulation symbol with the assigned reliability; and at least one radio receiving unit, wherein said radio transmission unit uses a communications channel for transmitting modulated symbols to said at least one receiving unit.

24. A radio transmission unit for a radio communications system, comprising:

encoding means for encoding data that is to be transmitted over a communications channel to a receiving unit outputting differently coded bits;

modulating means mapping said differently coded bits to different modulation symbols of a symbol alphabet, to which different modulation symbols different relative reliabilities are assigned, wherein by mapping said coded bits to said modulation symbols, different reliabilities are associated to differently coded bits depending on the conditions on said communications channel; and transmitting means for transmitting each modulation symbol with the assigned reliability.

25. A transmission encoder for a radio transmission unit of a radio communications system, comprising:

encoding means for encoding data that is to be transmitted over a communications channel from a radio transmission unit to a radio receiving unit, said encoding means outputting at least two differently coded bits; and modulating means mapping said differently coded bits to different modulation symbols of a symbol alphabet, to which different modulation symbols different relative reliabilities are assigned, wherein by mapping said coded bits to said modulation symbols, different reliabilities are associated to differently coded bits depending on the conditions on said communications channel.

* * * * *